United States Patent [19]

Corcoran et al.

[11] Patent Number: 5,155,388
[45] Date of Patent: Oct. 13, 1992

[54] LOGIC GATES WITH CONTROLLABLE TIME DELAY

[75] Inventors: John J. Corcoran, Portola Valley; Kenneth D. Poulton, Palo Alto, both of Calif.

[73] Assignee: Hewlett-Packard Company, Palo Alto, Calif.

[21] Appl. No.: 632,275

[22] Filed: Dec. 20, 1990

[51] Int. Cl.⁵ ................. H03K 19/23; H03K 5/22; H03K 19/20

[52] U.S. Cl. ......................... 307/464; 307/355; 307/455; 307/592

[58] Field of Search ............... 307/443, 455, 454, 355, 307/360, 362, 363, 475, 464, 592

[56] References Cited

U.S. PATENT DOCUMENTS

| | | | |
|---|---|---|---|
| 4,680,480 | 7/1987 | Hopta | 307/455 X |
| 4,714,841 | 12/1987 | Shoji et al. | 307/355 X |
| 4,737,663 | 4/1988 | Varadarajan | 307/455 |
| 4,806,791 | 2/1989 | Mizuide | 307/355 |
| 4,902,916 | 2/1990 | Cecchi et al. | 307/355 X |
| 4,928,025 | 5/1990 | Kokado | 307/355 X |
| 5,028,815 | 7/1991 | Van De Plassche | 307/355 |

Primary Examiner—Edward P. Westin
Assistant Examiner—Andrew Sanders

[57] ABSTRACT

Apparatus for introduction of a controllable time delay in the transition of a logic device output signal from a first logical level to a second logical level, in response to change of an input signal, or the difference of two input signals from a third logical level to a fourth logical level, delivered to the logic device. In a first embodiment, a limiting amplifier receives an input signal $S_{in}$ and a threshold signal $V_T$ at its two terminals and forms an amplified difference output signal $S_{out}$. A selected voltage level signal $V_L$ and $S_{out}$ are received at a signum function module and the output signal $sgn(S_{out}-V_L)$ is formed and issued. The signum output signal is multiplied by a controllable real number m and is added to $V_L$ to form the threshold signal $V_T$. The desired output signal $S_{out}$ makes a transition between the first and second logical levels, with a time delay that is controllable by choice of the number m. In a second embodiment, which also uses a signum function, two input signals, $S_{in,1}$ and $S_{in,2}$, give rise to two output signals, $S_{out,1}$ and $S_{out,2}$, and the difference signal $S_{out,1}-S_{out,2}$ makes a transition between two logical levels with a time delay that depends controllably on choice of the number m.

4 Claims, 3 Drawing Sheets

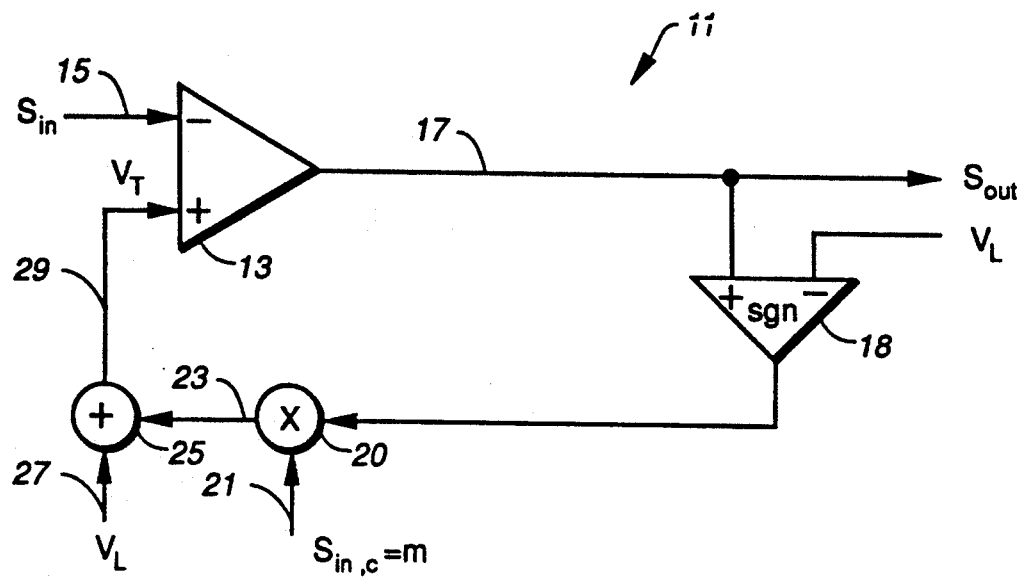
FIG._1
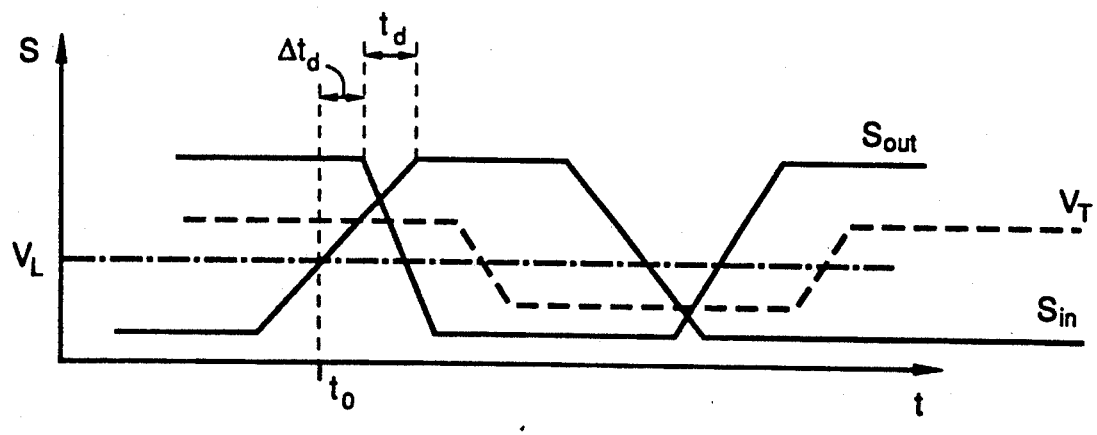
FIG._2

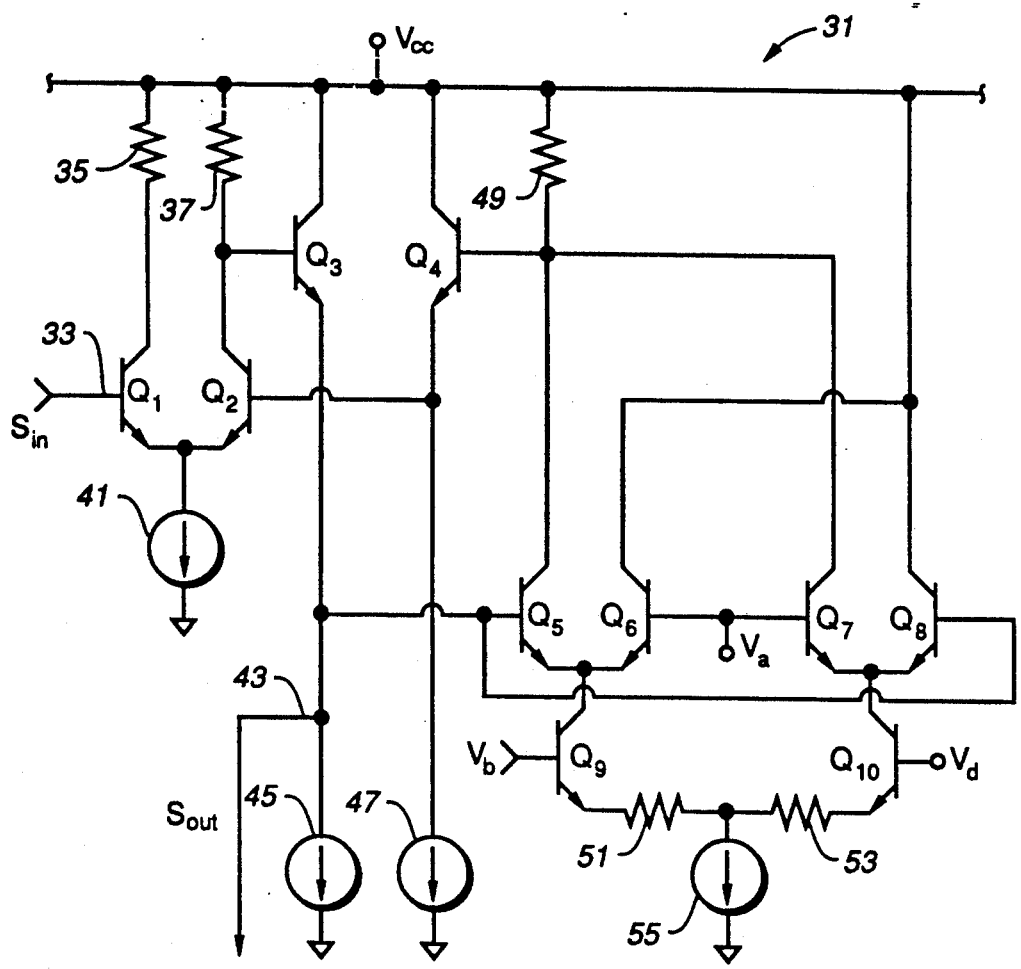
FIG._3
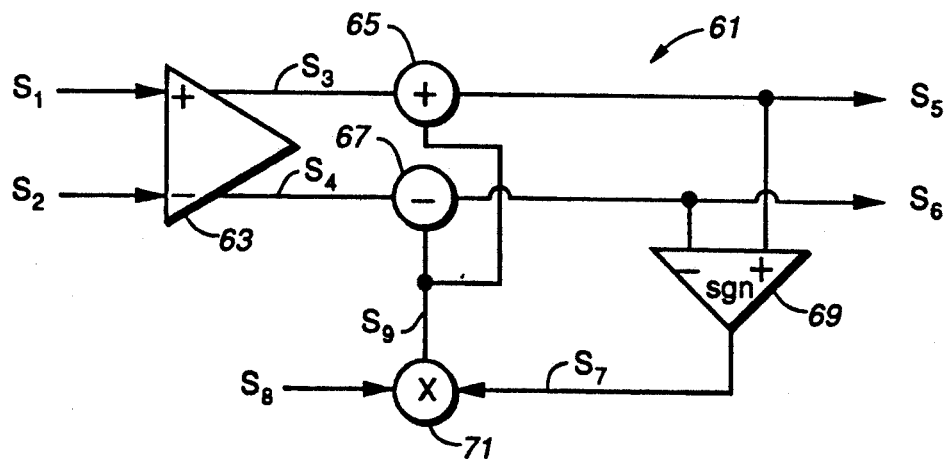
FIG._4

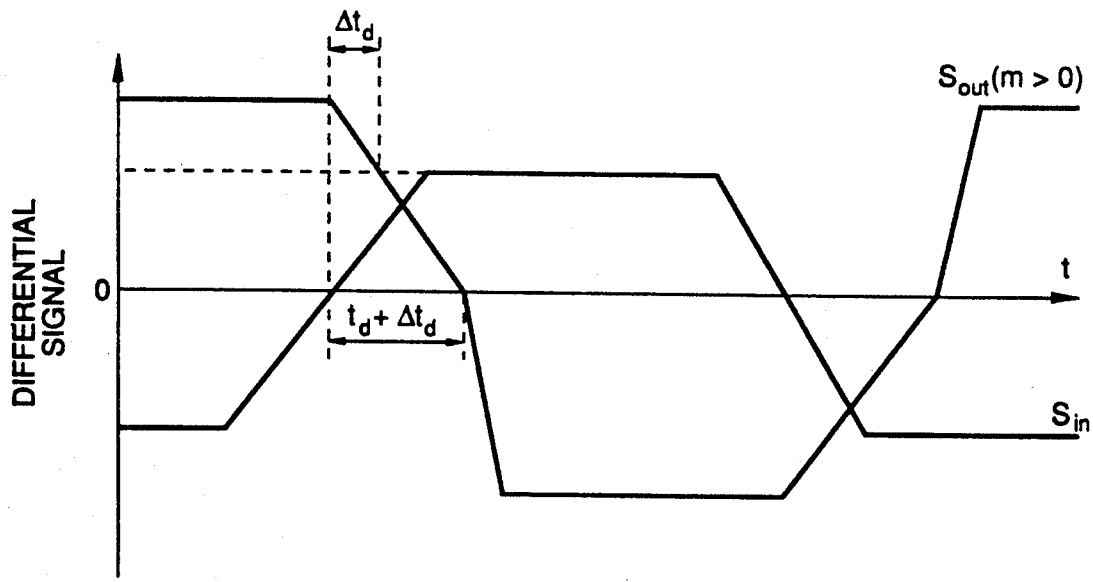
FIG._5
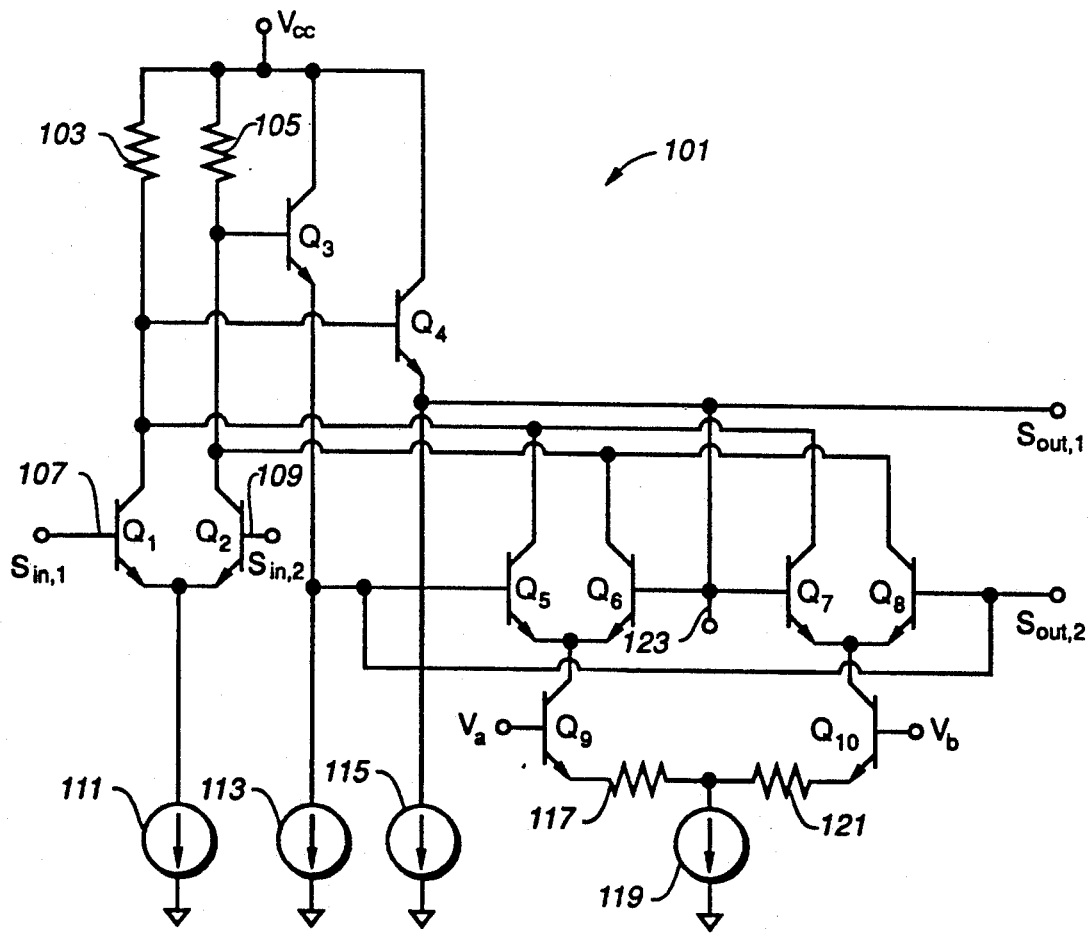
FIG._6

LOGIC GATES WITH CONTROLLABLE TIME DELAY

DESCRIPTION

1. Technical Field

This invention relates to two-level logic devices and to variable time delay means for varying the time at which a logic device makes a transition from a first logical level to a second logical level.

2. Background Art

Many analog and digital devices, such as analog-to-digital converters that receive time-interleaved clock pulse sequences, require clock signals that are staggered in time and are positioned at precisely defined time intervals. A major problem with such devices for systems that operate at gigahertz rates or higher is generating these staggered clock pulse sequences with small timing errors. Typically, the timing inaccuracy of consecutive clock pulse sequences can be no worse than 2-10 percent of the sample period, because small timing errors can cause larger errors when rapidly changing signals are digitized by ADC systems. These timing errors can be corrected by utilizing elements with variable time delay in the clock pulse generation circuits and by adjusting their respective time delays appropriately.

A large part of the delay of a logic gate arises from the time required for the input logic signal, which has a finite transition time, to move from a first logical level to the threshold level of the gate. At this threshold level, the output signal of the logic device will change from one logical level to another logical level. A difference must be provided between each of the first and second input logical levels and the threshold level in order to maintain a desired noise margin.

What is needed is an approach that provides a variable, preferably continuously variable, time delay for transition of the logic device output signal from one output logical level to another output logical level, based on one or more input control variables that are provided for the system.

SUMMARY OF THE INVENTION

These needs are met by providing a variable threshold voltage logic element. The threshold voltage is controllably varied, using multiplication means, summation means and Signum function means. In one embodiment where a single signal controls the change of logical level, a limiting amplifier provides one of two input signals for a Signum function module (sgn(x) = x/abs(x) for $x \neq 0$, where abs(x) is the absolute value of the number x), with the other input signal being determined by a threshold voltage $V_L$. Multiplication means is also provided, having two input terminals and an output terminal, for receiving the output signal of the Signum function module at a first input terminal, for receiving a first control input signal representing a numerical value m at a second input terminal, and for forming and issuing the product of these two input signals at the output terminal. This apparatus includes summation means, having two input terminals and having an output terminal that is connected to the positive (or negative) input terminal of the amplifier, for receiving the multiplication means output signal at a first input terminal, for receiving a second control signal representing a logic threshold value $V_L$ at a second input terminal, and for forming and issuing at the output terminal the sum $V_T$ of these two input signals. If an input signal $S_{in}$ is received at the negative input terminal of the amplifier and crosses the threshold level $V_T$ at a time $t = t_O$, the output signal issued by the limiting amplifier undergoes a change from one logical level to another logical level at a time $t = t_O + t_d + \Delta t_d$, where $\Delta t_d$ is a controllable time delay interval that depends upon m and $t_d$ is the time delay of the amplifier for m=0.

A second embodiment for introducing a controllable time delay uses the difference of two independent input signals. The apparatus includes signal input means having one or more input terminals and two output terminals, for receiving input signals $S_1$ and $S_2$ and for producing and issuing these input signals as two intermediate output signals $S_3$ and $S_4$ at the two output terminals. The apparatus also includes sum and difference means and multiplication means having first and second input terminals to receive the two intermediate signals $S_3$ and $S_4$ thereat, having a third input terminal to receive a control input signal $S_8$ thereat representing a numerical value m for an arbitrary choice of the real number m, having a fourth input terminal for receiving the control signal $S_7$ from a signum function module, and having two output terminals, for issuing the output signals $S_5 = S_3 + mS_7$ and $S_6 = S_4 - mS_7$. The time delay between the differential input signal $S_1 - S_2$ and the differential output signal $S_5 - S_6$ may be controllably varied by varying the numerical value m associated with the control input signal $S_8$.

BRIEF DESCRIPTION OF THE DRAWINGS

FIG. 1 is a schematic view of one embodiment of the invention, useful where a single input signal determines the output signal logical level.

FIG. 2 illustrates graphically the shift in time for transition of the output signal, relative to the time at which the input signal crosses the threshold value, using the embodiment shown in FIG. 1.

FIG. 3 is another embodiment of the invention, useful for single input signals.

FIGS. 4 and 6 are schematic views of two other embodiments of the invention, useful where the difference of two input signals determines the change from one logical level to another logical level in the output signal.

FIG. 5 illustrates graphically the shift in time for transition of the output signal for the embodiment shown in FIG. 4.

BEST MODE FOR CARRYING OUT THE INVENTION

With reference to FIG. 1, one embodiment 11 of apparatus for practicing the invention includes a limiting amplifier 13 having positive and negative input terminals as shown and an output terminal.

The negative input terminal of the amplifier 13 receives an input signal $S_{in}$ on an input line 15 at the amplifier negative terminal and issues an output signal $S_{out}$ on an output line 17. The output signal is also fed to the positive input terminal of a two-input signum function module 18 whose negative input terminal receives a nominal threshold voltage signal $V_L$. The output signal of the signum function module 18 is the signal $$S_{18} = \text{sgn}(S_{out} - V_L).$$

-continued $$\begin{aligned} \text{sgn}(x) &= x/\text{abs}(x) \quad (x \neq 0) \\ &= +1 \text{ if } x > 0 \\ &= -1 \text{ if } x < 0 \\ &= 0 \text{ if } x = 0. \end{aligned}$$

The signum function module output signal $S_{18}$ is fed to one input terminal of a two-input multiplier module 19 that receives a control input signal $S_{in,c}$ representing a selectable real number m on an input control line 21 at the other input terminal. The multiplier module 19 forms the product of these two input signals, $m \cdot \text{sgn}(S_{out} - V_L) = S_{19}$ and issues this product signal at an output terminal that is carried by a signal transport line to a signal summation means 25. The summation means 25 receives the product signal $S_{19}$ and receives a voltage representing the threshold voltage value $V_L$ (for change of output signal) on a second input control line 27. The sum of these two input signals received by the summation means 25 is issued as a threshold signal $V_T = V_L + m \cdot \text{sgn}(S_{out} - V_L)$ on an output line 29 that is received by the positive input terminal of the amplifier 13, thus completing a feedback loop as shown.

FIG. 2 illustrates graphically a representative input signal $S_{in}(t)$ and the resulting output signal $S_{out}(t)$, for a positive transition and for a negative transition of the input signal $S_{in}(t)$, where $V_T$ is varied as shown, and where the multiplier input m is greater than zero. The variable time delay $t_d$ is incurred in the time required for the input signal to traverse the voltage difference between $V_L$ and $V_T$, where $V_L$ is the nominal logic threshold, and $V_T$ is the logic threshold modified by the action of the signum, multiplier and adder means. Since this modification is directly proportional to m, and since m can be of either sign, $t_d$ can also be either positive or negative.

FIG. 3 illustrates an explicit embodiment 31 of apparatus that also produces a time delay in transition between two logical levels for a single input signal. The embodiment 31 includes ten bipolar npn transistors Q1, Q2, ..., Q10, each having a collector, a base and an emitter, in a configuration well known to workers in this art. The first two transistors Q1 and Q2 have their emitters connected together to a first terminal of a first current source 41 as shown. The collectors of the transistors Q1 and Q2 are connected through first and second resistors 35 and 37, respectively, to a constant voltage source $V_{cc}$. The base of the transistor Q1 receives an input signal $S_{in}$ on an input signal line 33. The collector of the transistor Q2 is connected to the base of a third transistor Q3, whose collector is connected directly to the voltage source $V_{cc}$. The emitter of the third transistor Q3 is connected to a first terminal of a second current source 45. The base of the second transistor Q2 is connected to the emitter of a fourth transistor Q4, whose collector is also connected directly to the voltage source $V_{cc}$. The base of the fourth transistor Q4 is connected through a third resistor 49 to the voltage source $V_{cc}$, and the emitter of the fourth transistor Q4 is connected to the base of the second transistor Q2 and to a first terminal of a third current source 47. The emitter of the third transistor Q3 is connected to the bases of a fifth transistor Q5 and an eighth transistor Q8. The collectors of the fifth transistor Q5 and of a seventh transistor Q7 are connected together to the base of the fourth transistor Q4, and the emitters of fifth and sixth transistors Q5 and Q6 are connected together to the collector of a ninth transistor Q9. The collectors of the sixth and eighth transistors Q6 and Q8 are connected together to the voltage source $V_{cc}$, and the bases of the sixth and seventh transistors Q6 and Q7 are connected together. The emitters of the seventh and eighth transistors are connected together to the collector of a tenth transistor Q10. The emitter of the ninth transistor Q9 is connected through a fourth resistor 51 to a first terminal of a fourth current source 55, and the emitter of the tenth transistor Q10 is connected through a fifth resistor 53 to the same terminal of this current source 55. Additional control voltages $V_a$, $V_b$ and $V_d$ are input to the bases of the transistors Q6 and Q7, to the base of the ninth transistor Q9 and to the base of the tenth transistor Q10, respectively. The output signal $S_{out}$ is received on an output line 43 from the emitter of the third transistor Q3. Any of the current sources 41, 45, 47 and 55 may be replaced by resistors connected to suitable voltage sources.

FIG. 4 illustrates an embodiment 61 of apparatus that is useful where the logical level output signal is determined by the difference of two input signals. A gate 63 receives two input signals $S_1$ and $S_2$ on two input lines as shown, amplifies these signals (optional), and issues the resulting signals as intermediate signals $S_3$ and $S_4$. The intermediate signals $S_3$ and $S_4$ are received by one terminal of a two-input adder 65 and by one terminal of a two-input subtracter 67, respectively, whose other input signals are described below. Output signals $S_5$ and $S_6$ from the adder 65 and subtracter 67, respectively, serve as output signals of the apparatus 61 and are also directed to two input terminals of a signum function module 69 whose output signal is $S_7 = \text{sgn}(S_5 - S_6)$. The output signal $S_7$ is received by one input terminal of a two-input multiplier 71 whose other input terminal receives a controllably variable multiplier signal $S_8$ whose value is a real number m. The output product function $S_9 = m \cdot \text{sgn}(S_5 - S_6)$ is then received by the second input terminal of each of the adder 65 and subtracter 67. The output signals $S_5$ and $S_6$ thus become $S_5 = S_3 + m \cdot S_7$ and $S_6 = S_4 - m \cdot S_7$, respectively. The difference of these two output signals becomes $S_5 - S_6 = S_3 - S_4 + 2m \cdot S_7$.

FIG. 5 illustrates graphically a representative differential input signal $S_{in}(t)$ and the resulting output signal $S_{out}(t)$, for a positive and negative transition of the input signal $S_{in}(t)$, with $m > 0$. The input signal is assumed to have a nominal amplitude, whereas the output signal amplitude will vary depending on the control input m. With m positive in FIG. 5, the output amplitude is depicted as larger than the input amplitude. The variable delay $\Delta t_d$ is incurred in the time required for the output signal to traverse the voltage difference between the output high (or low) level with $m \neq 0$, and the output high (or low) level with $m = 0$. Since m can be positive or negative, $\Delta t_d$ can also be positive or negative.

FIG. 6 illustrates an explicit embodiment 101 of apparatus that is useful where the logical output signal is determined by the difference of two input signals. The embodiment 101 includes twelve bipolar npn transistors Q1, Q2,..., Q12. First and second bipolar transistors Q1 and Q2 are connected to a constant voltage source $V_{cc}$ through first and second resistors 103 and 105, respectively. The bases of the first and second transistors Q1 and Q2 receive input signals $S_{in,1}$ and $S_{in,2}$, respectively on the respective input signal lines 107 and 109. The emitters of the first and second transistors Q1 and Q2 are connected together to a first terminal of a first current source 111. The collector of the second transistor Q2 is connected to the base of a third transistor Q3 that is directly connected at its collector to the voltage source $V_{cc}$. The emitter of the third transistor Q3 is connected to a first terminal of a second current source 113. The collector of the first transistor Q1 is connected to the base of a fourth transistor Q4 whose collector is directly connected to the voltage source $V_{cc}$. The emitter of the fourth transistor Q4 is connected to a first terminal of a third current source 115 and also furnishes a first output signal $S_{out,1}$. Fifth and sixth transistors Q5 and Q6 have their collectors connected to the collectors of the first and second transistors Q1 and Q2, respectively. The bases of the fifth and sixth transistors Q5 and Q6 are connected to the emitters of the third and fourth transistors Q3 and Q4, respectively. Seventh and eighth transistors Q7 and Q8 have their collectors connected to the collectors of the first and second transistors Q1 and Q2, respectively. The base of the seventh Q7 is connected to the base of the sixth transistor Q6, and the bases of the fifth and eighth transistors Q5 and Q8 are connected together. A ninth transistor Q9 has its collector connected to the emitters of the fifth and sixth transistors Q5 and Q6, and has its emitter connected across a third resistor 117 to a first terminal of a fourth current source 119. A tenth transistor Q10 has its collector connected to the emitters of the seventh and eighth transistors Q7 and Q8 and has its emitter connected to the first terminal of the fourth current source 119 across a fourth resistor 121. The bases of the ninth and tenth transistors Q9 and Q10 receive control input voltages $V_a$ and $V_b$, respectively. A second output signal $S_{out,2}$ is received from the base of the eighth transistor Q8.

An initial stage, including the first and second transistors Q1 and Q2, forms the difference of the two input signals $S_{in,1}$ and $S_{in,2}$. A multiplier, including the fifth, sixth, seventh, eighth, ninth and tenth transistors Q5, Q6, Q7, Q8, Q9 and Q10 performs a multiplication of this difference signal by a multiplication coefficient m that depends upon and is controlled by the control input voltages $V_a$ and $V_b$.

We claim:

1. Apparatus for introducing a controllable time delay in the time for switching of a signal from one logical level to another second logical level, the apparatus comprising:

a limiting amplifier having first and second input terminals to receive first and second input signals thereat, and having an output terminal to issue an output signal whose amplitude varies monotonically with the difference of the first and second input signals received by the limiting amplifier;

signum function means, having two input terminals and an output terminal, for receiving the amplifier output signal at a first input terminal, for receiving a predetermined logic threshold voltage $V_L$ at a second input terminal, and for forming and issuing the signum function of the difference of these two signals as a signum output signal at the output terminal;

multiplication means, having two input terminals and an output terminal, for receiving the signum function output signal at a first input terminal, for receiving a control signal representing a non-zero voltage value m at a second input terminal, and for forming and issuing the product of these two input signals as a multiplication means output signal at the output terminal;

summation means, having two input terminals, and having an output terminal that is connected to the second input terminal of the amplifier, for receiving the multiplication means output signal at a first input terminal, for receiving the logic threshold voltage $V_L$ at a second input terminal, and for forming and issuing at the output terminal the sum of the two input signals;

whereby, if an input signal is received at the first input terminal of the amplifier and changes from a first logical level to a second logical level at a time $t = t_c$, the output signal issued by the amplifier undergoes a change from one logical level to another logical level at a time $t = t_c + t_d + \Delta t_d$, where $\Delta t_d$ is a controllable time delay interval that depends upon the numerical value m and $t_d$ is a predetermined time delay.

2. Apparatus for introducing a controllable time delay in the time for switching of a signal from a first logical level to a second logical level, the apparatus comprising a constant voltage source having a predetermined voltage:

first, second, third and fourth current sources, each having two terminals, with a first terminal of each current source being connected to a the constant voltage source with predetermined voltage;

first and second bipolar transistors whose collectors are connected through first and second resistors, respectively, to the constant voltage source, and whose emitters are both connected to the second terminal of the first current source, with the base of the first transistor receiving an input signal;

third and fourth bipolar transistors whose collectors are connected to the constant voltage source, whose emitters are connected to second terminals of the second and third current source, respectively, with the base of the third transistor being connected to the collector of the second transistor, and with the emitter of the fourth transistor being connected to the base of the second transistor;

fifth and sixth bipolar transistors whose emitters are connected together, with the collector of the fifth transistor being connected to the constant voltage source through a third resistor, with the collector of the sixth transistor being connected to the constant voltage source, and with the base of the fifth transistor being connected to the emitter of the third transistor;

seventh and eighth bipolar transistors whose emitters are connected together, with the bases of the sixth and seventh transistors being connected together, with the collector of the seventh transistor being connected to the base of the fourth transistor, with the collectors of the sixth and eighth transistors being connected together, with the bases of the fifth and eighth transistors being connected together, and with the collector of the eighth transistor being connected to the constant voltage source;

a ninth bipolar transistor whose collector is connected to the emitter of the sixth transistor, and whose emitter is connected through a fourth resistor to the second terminal of the fourth current source;

a tenth bipolar transistor whose collector is connected to the emitter of the seventh transistor, and whose emitter is connected through a fifth resistor to the first terminal of the fourth current source;

where the bases of the sixth and seventh transistors are connected to a first control voltage source, where the base of the ninth transistor is connected to a second control voltage source, and where the base of the tenth transistor is connected to a third control voltage source; and where the output signal of the apparatus is received from the emitter of the third transistor.

3. Apparatus for introducing a controllable time delay in the time for switching of a signal from a first logical level to a second logical level, the apparatus comprising:

signal input means having two input terminals and two output terminals, for receiving two input signals $S_1$ and $S_2$ and for producing and issuing first and second intermediate signals $S_3$ and $S_4$ at the two output terminals;

sum means, having two input terminals and an output terminal, for receiving the signal $S_3$ at a first input terminal, for receiving another signal at the second input terminal, and for forming and issuing the sum of these two input signals as an output signal at the output terminal;

difference means, having two input terminals and an output terminal, for receiving the signal $S_4$ at a first input terminal, for receiving another signal at the second input terminal, and for forming and issuing the difference of these two input signals as an output signal;

signum function means, having two input terminals and an output terminal, for receiving the output signals from the sum means and the difference means at the first and second input terminals, respectively and for forming and issuing the signum function of the difference of these two signals as an output signal at the output terminal;

multiplication means, having two input terminals and an output terminal, for receiving the signum function means output signal at a first input terminal, for receiving a control signal representing a non-zero voltage value m at a second input terminal, and for forming and issuing the product of these two input signals as a multiplication means output signal at the output terminal, where the multiplication means output signal is received at the second terminals of the sum means and of the difference means;

whereby the sum means output signal and the difference means output signal represent the output signals and the difference signal that is the difference of these two signals begins to change from a first logical level to a second logical level at a time that may be continuously varied by varying the voltage value m.

4. Apparatus for introducing a controllable delay in the time for switching of a signal from a first logical level to a second logical level, the apparatus comprising a constant voltage source having a predetermined voltage;

first, second, third and fourth current sources, each having two terminals, with a first terminal of each current source being connected to the constant voltage source;

first and second bipolar transistors whose collectors are connected through first and second resistors, respectively to the constant voltage source and whose emitters are both connected to the second terminal of the first current source, with the bases of the first and second transistors receiving input signals $S_{in,1}$ and $S_{in,2}$, respectively;

third and fourth bipolar transistors whose collectors are connected to the voltage source, whose bases are connected, respectively, to the collectors of the second and first transistors, and whose emitters are connected, respectively, to the second terminal of the second current source and to the second terminal of the third current source;

fifth and sixth bipolar transistors whose collectors are connected, respectively, to the collectors of the first and second transistors, and whose bases are connected, respectively, to the emitters of the third and fourth transistors;

seventh and eighth bipolar transistors whose collectors are connected, respectively, to the collectors of the first and second transistors, with the bases of the sixth and seventh transistors being connected together, and with the bases of the fifth and eighth transistors being connected together;

a ninth transistor whose collector is connected to the emitters of the fifth and sixth transistors, and whose emitter is connected across a fifth resistor to the second terminal of the fourth current source;

a tenth transistor whose collector is connected to the emitters of the seventh and eighth transistors and whose emitter is connected across a sixth resistor to the second terminal of the fifth current source;

where a first output signal of the apparatus is received from the emitter of the fourth transistor, where a second output signal is received from the base of the eighth transistor, and where the bases of the ninth and tenth transistors receive first and second control input signals, respectively, that determine the time delay f or change of the output signal $S_{out}$ from a first logical level to a second logical level, due to a change in the difference of the input signals $S_{in,1} - S_{in,2}$ from a third logical level to a fourth logical level.

* * * * *